United States Patent
Gurunathan et al.

(10) Patent No.: US 9,961,797 B2
(45) Date of Patent: May 1, 2018

(54) AIR COOLED FUEL CELL SYSTEM

(71) Applicant: BLOOM ENERGY CORPORATION, Sunnyvale, CA (US)

(72) Inventors: Ranganathan Gurunathan, Bangalore (IN); Deepak Balakrishnan, Bangalore (IN); Rajkannu Govindan, Bangalore (IN); Navaneetha Krishnan, Bangalore (IN); David Trevisan, San Jose, CA (US); Arne Ballantine, Palo Alto, CA (US); Jessica Mahler, Mountain View, CA (US); Ross Parker, Santa Clara, CA (US); Zachary Odenheimer, Saratoga, CA (US); Gilbert Richards, San Jose, CA (US)

(73) Assignee: BLOOM ENERGY CORPORATION, Sunnyvale, CA (US)

( * ) Notice: Subject to any disclaimer, the term of this patent is extended or adjusted under 35 U.S.C. 154(b) by 173 days.

(21) Appl. No.: 14/850,044

(22) Filed: Sep. 10, 2015

(65) Prior Publication Data

US 2016/0079613 A1 Mar. 17, 2016

Related U.S. Application Data

(60) Provisional application No. 62/050,424, filed on Sep. 15, 2014.

(51) Int. Cl.
*H01M 8/02* (2016.01)
*H01M 8/24* (2016.01)
*H05K 7/20* (2006.01)

(52) U.S. Cl.
CPC ......... *H05K 7/20154* (2013.01); *H01M 8/02* (2013.01); *H01M 8/24* (2013.01); *H05K 7/20163* (2013.01); *H01M 2250/00* (2013.01)

(58) Field of Classification Search
CPC ............... H01M 8/02; H01M 8/04007; H01M 8/04014; H01M 8/04074; H01M 8/04738;
(Continued)

(56) References Cited

U.S. PATENT DOCUMENTS 6,164,369 A * 12/2000 Stoller .................. H05K 7/206
165/104.33
7,573,713 B2 * 8/2009 Hoffman ............ H05K 7/20136
165/80.3

(Continued)

FOREIGN PATENT DOCUMENTS

DE 9111434 U1 * 12/1991 ............. H02B 1/565
DE 102004030675 A1 * 11/2005 ............. H05K 7/202
(Continued)

*Primary Examiner* — Gregg Cantelmo
(74) *Attorney, Agent, or Firm* — The Marbury Law Group PLLC

(57) ABSTRACT

An air-cooled electronics module is disclosed. The air-cooled electronics module includes a housing and a heat exchanger disposed within the housing and separating the housing into a first portion and a second portion. The air-cooled electronics module also includes one or more electronic components disposed within the first portion, and one or more additional electronic components disposed within the second portion. The air-cooled electronics module further includes at least one fan configured to blow air into the second portion. The air in the first portion is substantially stagnant.

15 Claims, 13 Drawing Sheets

(58) Field of Classification Search
CPC ......... H01M 8/04731; H01M 10/6561; H01M 10/6563; H01M 10/66; H01M 10/667; F28D 2021/0028; F28D 2021/0029; H01L 23/34; H01L 23/345; H01L 23/42; H01L 23/44; H01L 23/40; H01L 23/467; H01L 23/473; H01G 3/086; H01G 3/081; H01G 3/08; B65D 1/24; B65D 1/36; B65D 25/04

See application file for complete search history.

(56) References Cited

U.S. PATENT DOCUMENTS

| | | | |
|---|---|---|---|
| 7,705,490 B2 | 4/2010 | Srinivasan et al. | |
| 7,713,649 B2 | 5/2010 | Hickey et al. | |
| 7,872,864 B2* | 1/2011 | Mongia | G06F 1/20 361/694 |
| 8,440,362 B2 | 5/2013 | Richards et al. | |
| 2006/0171115 A1* | 8/2006 | Cramer | H02M 7/003 361/695 |
| 2008/0112135 A1* | 5/2008 | Kleinecke | H05K 7/206 361/696 |
| 2011/0108250 A1* | 5/2011 | Horng | G06F 1/28 165/121 |
| 2011/0281185 A1 | 11/2011 | Sridhar et al. | |
| 2013/0104739 A1* | 5/2013 | Suzuki | B01D 53/22 96/4 |
| 2014/0246169 A1* | 9/2014 | Perrin | H05K 7/2089 165/47 |
| 2014/0272612 A1 | 9/2014 | Trevisan et al. | |
| 2015/0022972 A1* | 1/2015 | Kwon, II | F24F 7/007 361/690 |

FOREIGN PATENT DOCUMENTS

| | | | | |
|---|---|---|---|---|
| WO | WO 2010065182 A1 * | 6/2010 | .......... | H01M 2/1077 |
| WO | WO 2013083421 A1 * | 6/2013 | .......... | H05K 7/2089 |

* cited by examiner

AIR COOLED FUEL CELL SYSTEM

TECHNICAL FIELD

The present disclosure generally relates to fuel cell systems and, more particularly, to air cooled fuel cell systems.

BACKGROUND

In some fuel cell systems, the electronic components are housed in a separate, air conditioned module from the fuel cell module. This, however, results in a large system size and a reduction in efficiency due to poor heat transfer and loss in the air conditioner. In some fuel cell systems, electronic components are water cooled. This, however, results in the same complexity as air conditioning. For example, the leak-prone coolant must be circulated through the electronic components in order to cool the electronic components. Further, concurrent maintenance is considerably less appropriate because cooling lines must be disconnected during operation.

SUMMARY

The present disclosure describes, in one aspect, an air-cooled electronics module. The air-cooled electronics module includes a housing and a heat exchanger disposed within the housing and separating the housing into a first portion and a second portion. The air-cooled electronics module also includes one or more electronic components disposed within the first portion, and one or more additional electronic components disposed within the second portion. The air-cooled electronics module further includes at least one fan configured to blow air into the second portion. The air in the first portion is substantially stagnant.

In another aspect, the present disclosure describes a fuel cell module cabinet. The fuel cell module cabinet includes a first compartment that contains at least one air-cooled electronics module, and a second compartment that contains one or more power generation components. The at least one air-cooled electronics module includes a housing and a heat exchanger disposed within the housing and separating the housing into a first portion and a second portion. The at least one air-cooled electronics module also includes one or more electronic components disposed within the first portion, and one or more additional electronic components disposed within the second portion. The at least one air-cooled electronics module also includes at least one fan configured to blow air into the second portion. The air in the first portion is substantially stagnant.

In another aspect, the present disclosure describes a fuel cell system. The fuel cell system includes a base, at least one fuel cell system module disposed on the base, and at least one of a fuel processing module or a power conditioning module disposed on the base. The at least one fuel cell system module includes a fuel cell module cabinet connected, through the base, with at least one of the fuel processing module or the power conditioning module. The fuel cell module cabinet includes a first compartment containing at least one air-cooled electronics module and a second compartment containing a hot box containing one or more fuel cell stacks and a balance of plant subsystem. The air-cooled electronics module includes a housing and a heat exchanger disposed within the housing and separating the housing into a first portion and a second portion. The air-cooled electronics module also includes one or more electronic components disposed within the first portion, and one or more additional electronic components disposed within the second portion. The air-cooled electronics module further includes at least one fan configured to blow air into the second portion. The air in the first portion is substantially stagnant.

In yet another aspect, the present disclosure describes a method of operating a fuel cell system. The method includes generating current from one or more fuel cell stacks in a hot box located in a first compartment of a fuel cell module cabinet. The method also includes providing the current from the hot box to an electronics module located in a second compartment of the fuel cell module cabinet. The electronics module includes a first portion containing at least one electronic component and a second portion containing at least one additional electronic component. Air contained in the first portion is substantially stagnant. The method further includes flowing cooling air into the second portion of the electronics module to remove heat from the first portion and the second portion.

BRIEF DESCRIPTION OF THE DRAWINGS

The accompanying drawings, which are incorporated herein and constitute part of this specification, illustrate examples of the disclosed devices and methods, and together with the general description given above and the detailed description given below, serve to explain the features of the invention.

DETAILED DESCRIPTION

Figure 1:
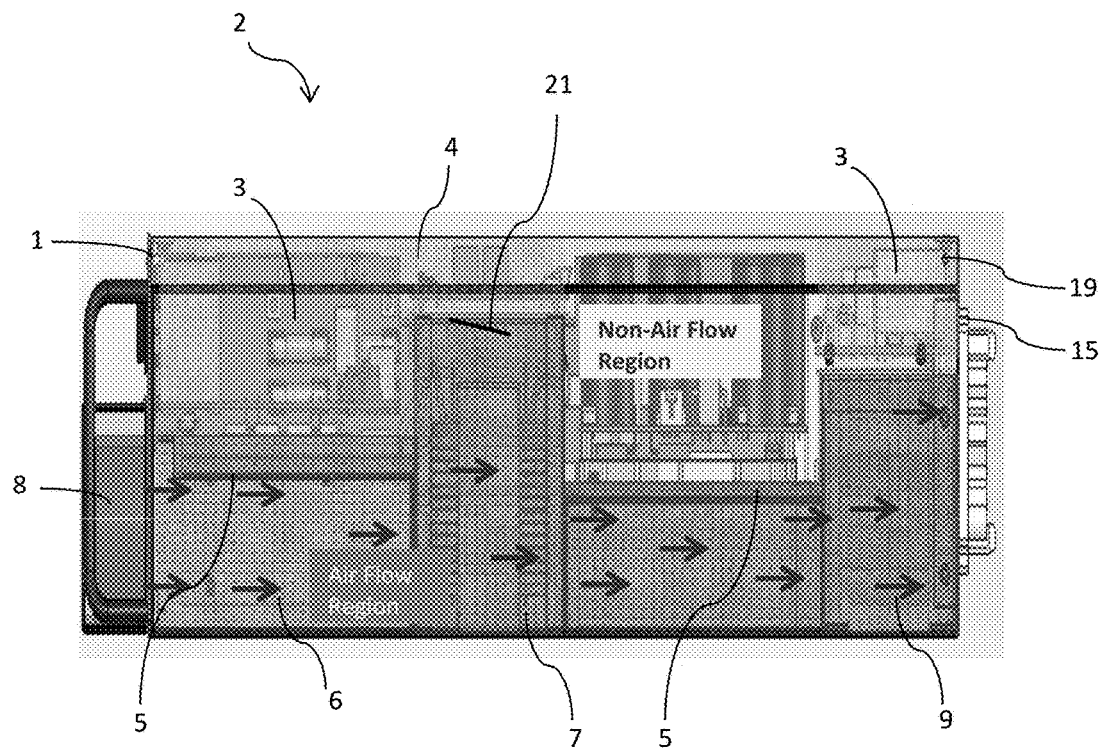
FIG. 1 is a schematic side view of an air-cooled electronics module according to the present disclosure.

The various examples will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. It is also understood that the examples shown in the figures are not mutually exclusive. Features shown in one example (e.g., in one figure) may be included in other examples (e.g., in other figures).

Air-Cooled Electronics Module

Electronics utilized in fuel cell systems may be cooled, e.g., by air, water, etc. The present inventors realized that when the electronic components are cooled by air, exposing such electronic components to a cooling air flow may cause corrosion and/or short circuits in the electronic components and/or on the electronics boards. This results in reduced lifetime for the power electronics modules. Two or more split (e.g., separate) air zones (e.g., dual air zones) may be provided for electronic components in a housing of a fuel cell system for electronic components. A first air zone may be substantially sealed, and may include pressurized air. The first air zone may include electronic components that are susceptible to corrosion and/or short circuits due to moisture, dust, fuel, or other contaminants in the air. The sensitive electronic components contained within the first air zone may not generate a substantial amount of heat compared to electronic components contained in the second air zone. The pressurized air may substantially prevent the most air and/or fuel and air mixtures from forming inside the first air zone on electronic components. Further, because the pressurized air is also substantially stagnant, moisture and other contaminants cannot enter the sensitive electronic components freely (e.g., there is no or limited air flow within the first air zone). A second air zone may include electronic components that are less susceptible to corrosion and/or short circuits due to moisture, dust, fuel, or other contaminants in the air. The less sensitive electronic components contained in the second air zone may generate a substantial amount of heat as compared to those contained within the first air zone, and therefore, may need cooling by air or other coolant flow. The less sensitive electronic components may be the major heat sources/generators and the electronic components in the second air zone may generate more heat during operation than the electronic components in the first air zone. An airflow with a speed may be provided (e.g., by one or more fans) in the second air zone to provide sufficient cooling for the heat generating electronic components contained therein. With the split air zones configuration, stagnant, substantially moisture free air is provided to the moisture sensitive lower heat generating electronic components contained within the first air zone, and flowing cooling air is provided to the less moisture sensitive, higher heat generating electronic components contained within the second air zone.

Figure 2:
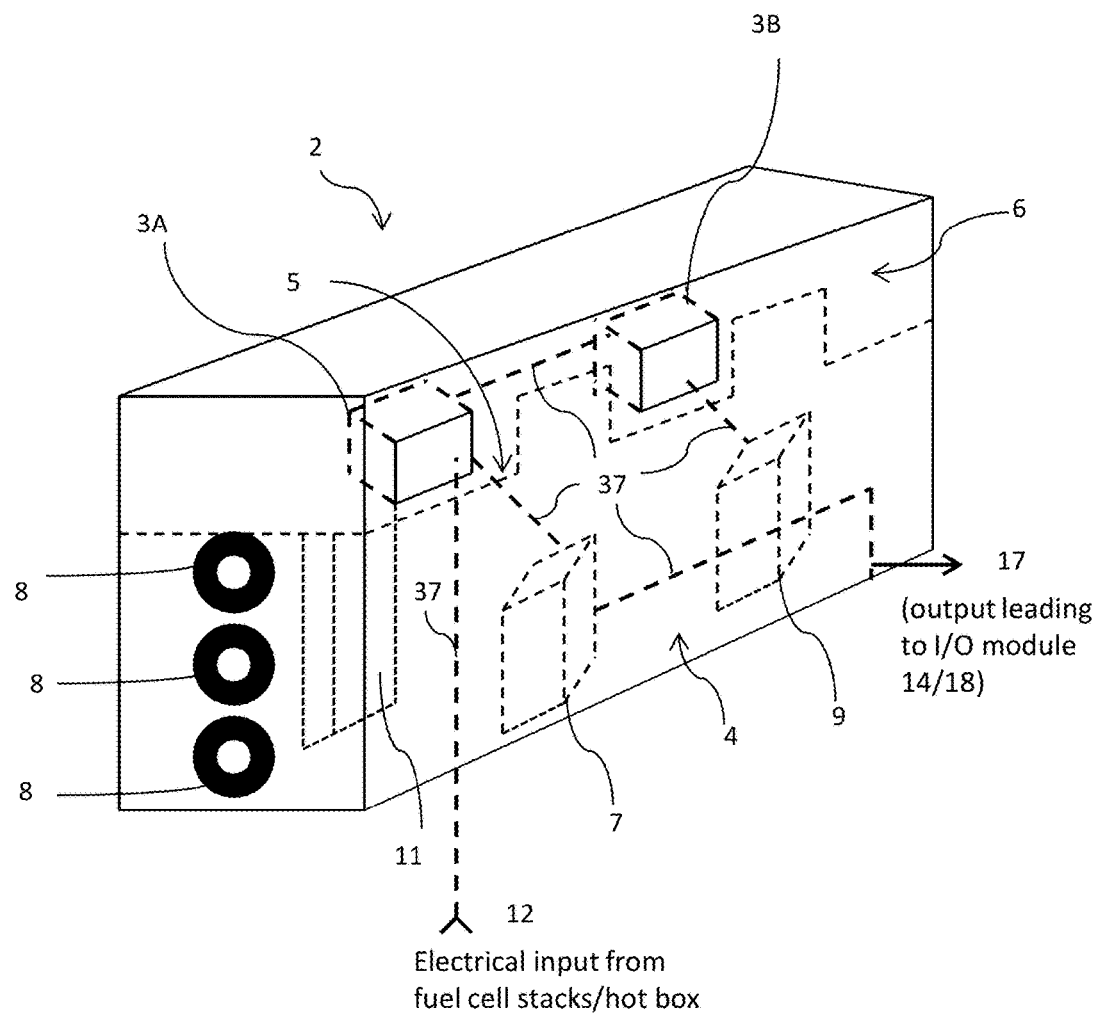
FIG. 2 depicts a schematic three dimensional perspective view of an air-cooled electronics module according to the present disclosure.

FIG. 1 is a schematic side view of an air-cooled electronics module 2 according to the present disclosure. The air-cooled electronics module 2 may be included in a fuel cell system module 100 (shown in, e.g., FIG. 4). The electronics module 2 may include a housing 1. The housing 1 may define a volume or space for containing various electronic components. In one example, the housing 1 may be separated into a first portion 4 (a first air zone 4 or a non-air flow region 4) and a second portion 6 (a second air zone 6 or an air flow region 6). These two separate portions (e.g., air zones) allow for separation of the air contained in the electronics module 2. The first portion 4 may be configured to contain one or more electronic components utilized in the fuel cell system module 100, including, for example, one or more DC/DC converters 3A (FIG. 2) and one or more control circuits 3B (FIG. 2). The one or more electronic components contained within the first portion 4 may not generate a substantial amount of heat, but may be susceptible to corrosion and/or short circuits due to moisture, dust, fuel, or other contaminants in the air. The second portion 6 may be configured to contain other electronic components, which may generate a substantial amount of heat, and may be less susceptible to corrosion and/or short circuits due to moisture, dust, fuel, or other contaminants in the air. The electronic components contained within the second portion 6 may include for example, a transformer 7 and/or an inductor 9. In some examples, the transformer 7 and/or the inductor 9 may be coated or painted with a protective material to prevent or reduce damages caused by the moisture, dust, fuel, or other contaminants within the cooling air.

Figure 4:
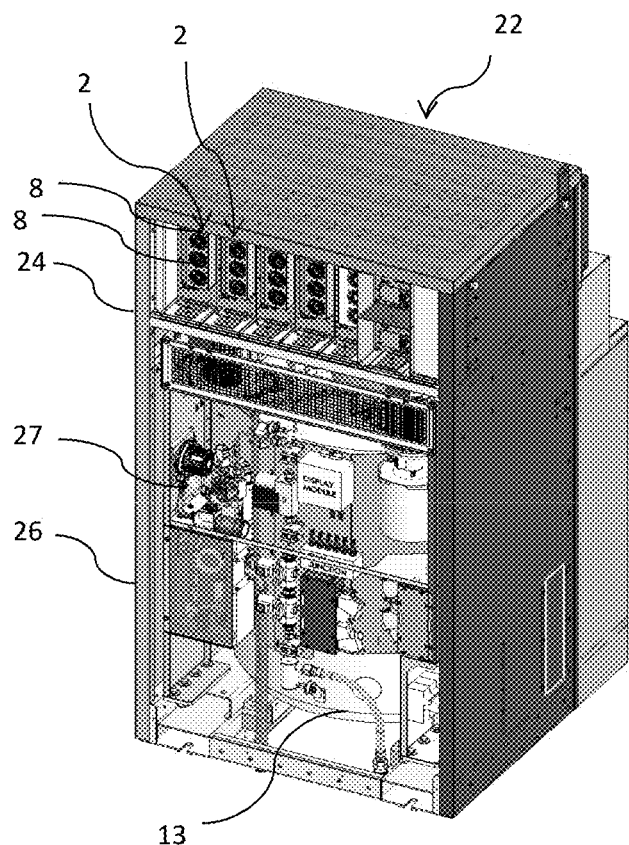
FIG. 4 depicts a three dimensional view of a fuel cell module cabinet including various electronics and components according to the present disclosure.

Referring to FIG. 1, the heat generating electronic components included in the second portion 6 may need cooling. The electronics module 2 may include at least one fan 8 disposed at least one end of the housing 1 (e.g., a front end, a rear end, or a side end). The at least one fan 8 may blow cooling air into the second portion 6 to cool the components contained within the second portion 6. As depicted in FIGS. 2 and 4, the electronics module 2 may include more than one fan 8 disposed at the front end (or rear end, side end) of the electronics module 2. The electronics module 2 may include a heat exchanger 5 disposed within the housing 1, separating the housing 1 into the first portion 4 and second portion 6. The heat exchanger 5, along with other separator(s), may substantially seal the first portion 4 from air included in the second portion 6, serving as a barrier to substantially prevent the cooling air in the second portion 6 from flowing into the first portion 4, thereby protecting the sensitive electronic components contained within the first portion 4 from moisture, fuel, dust, and/or other contaminants in the cooling air and the air in the atmosphere surrounding the housing 1. Air may flow within the second portion 6 at a desired speed to provide cooling to the electronic components disposed within the first portion 4, as discussed below. Air flow within the first portion 4 may be limited (e.g., substantially stagnant). In one example, the first portion 4 may contain pressurized air (e.g., at pressure greater than 1 atm, such as 1.1-2 atm), which further limits the air flow therein. Heat generated by the electronic components in the first portion 4 may be transferred (e.g., removed), through the heat exchanger 5, from the first portion 4 to the second portion 6 (e.g., by heat exchanging between the air contained within the first portion 4 and the heat exchanger 5), where the flowing cooling air contained within the second portion 6 carries away heat from the heat exchanger 5. Thus, the heat within the first portion 4 may be removed by the heat exchanger 5 and the cooling air in the second portion 6.

The heat exchanger 5 may include any suitable heat exchanging components or devices, such as a separator plate which is made of a thermally conductive material. For example, the heat exchanger 5 may include heat sinks, such as fins. The heat exchanger 5 may include any suitable materials, such as, for example, aluminum, an aluminum alloy, or any other metal or metal alloy that are suitable for heat exchange. In some examples, the heat exchanger 5 may include a horizontal or vertical plate hanging from the heat exchanger 5. For example, the heat exchanger 5 may include at least one fin 11 extending vertically from the heat exchanger 5 toward the second portion 6, as shown in FIG. 2. The at least one fin 11 may include aluminum, an aluminum alloy, or any other suitable material for heat exchange. The fin 11 may take any suitable shape or form, such as plate, honey-comb shape, etc. As the cooling air passes through the fin 11, the heat transferred to the fin 11 from air in the first portion 4 may be carried away by the cooling air (e.g., heat is exchanged between the fin 11 and the cooling air).

Referring to FIG. 1, the first portion 4 of the electronics module 2 may include a one-way inlet or valve 19 and a one-way outlet or valve 15. Although shown in FIG. 1 as disposed at the rear end of the electronics module 2, the one-way inlet 19 and/or the one-way outlet 15 may be disposed at any other suitable locations of the housing 1. When a pressure within the first portion 4 is below a first threshold pressure (e.g., $1.013 \times 10^5$ Pascal or 1 atm), the one-way outlet 15 may be sealed (e.g., closed), preventing air from flowing out of the first portion 4. When the pressure within the first portion 4 exceeds the first threshold pressure (e.g., due to an increase in the temperature of air contained in the first portion 4), the one-way outlet 15 may open to allow a portion of the air contained within the first portion 4 to exit the first portion 4 to the atmosphere outside of the housing 1, thereby reducing the pressure within the first portion 4. When the pressure within the first portion 4 is greater than a second threshold pressure (e.g., $1.013 \times 10^5$ Pascal or 1 atm), the one-way inlet 19 may be sealed (e.g., closed), thereby preventing air from flowing into the first portion 4 from the atmosphere. When the pressure within the first portion 4 is below the second threshold pressure (e.g., due to a decrease in the temperature of the air within the first portion 4), the one-way inlet 19 may open to allow air to flow into the first portion 4 from the atmosphere outside of the housing 1, thereby increasing the pressure within the first portion 4. The first threshold pressure may or may not be the same as the second threshold pressure. In some examples, the one-way inlet 19 and/or the one-way outlet 15 may include a permeable membrane, which is configured to permit air flow through it when a pressure on one side exceeds a threshold pressure.

Alternatively or additionally, the first portion 4 may include a one-way valve 21 located at a suitable portion in the heat exchanger 5 that separates the first portion 4 and the second portion 6. When the pressure within the first portion 4 is below a third threshold pressure (e.g., e.g., $2.026 \times 10^5$ Pascal or 2 atm), the one-way valve 21 may be sealed (e.g., closed), preventing the stagnant air within the first portion 4 from exiting into the second portion 6. When the pressure within the first portion 4 exceeds the third threshold pressure (e.g., due to the increase in the temperature of the air contained in the first portion 4), the one-way valve 21 may open to allow a portion of the air to flow from the first portion 4 into the second portion 6, thereby acting as a pressure relief valve. The air from the first portion 4 may flow through the one-way valve 21 to any suitable location of the second portion 6. In one example, the air from the first portion 4 may flow through the one-way valve 21 to the transformer 7. The one-way valve 21 may be any suitable valve. In one example, the one-way valve 21 may include a permeable membrane. The permeable membrane may be configured to allow the air within the first portion 4 to flow into the second portion 6 only when the pressure within the first portion 4 exceeds the third threshold pressure. The third threshold pressure may or may not be the same as the first and/or second threshold pressures. It is noted that the first portion 4 of the electronics module 2 contains substantially stagnant air except when the one-way inlet 19, one-way outlet 15, or one-way valve 21 is opened.

FIG. 2 shows a schematic three dimensional perspective view of the air-cooled electronics module 2 shown in FIG. 1, according to the present disclosure. As shown in FIG. 2, the air-cooled electronics module 2 may include more than one fan 8 (e.g., three fans) at the front end. In one example, the at least one fin 11 may extend toward the second portion 6 from the heat exchanger 5 that separates the first portion 4 and the second portion 6. As cooling air flows through the second portion 6, the cooling air exchanges heat with the at least one fin 11. Although not shown in FIG. 2, it is understood that the heat exchanger 5 may also include at least one fin 11 extending within the first portion 4 to exchange heat with the air contained in the first portion 4.

As shown in FIG. 2, the air-cooled electronics module 2 may further include an electrical input 12. The electrical input 12 may include electrical connections (wired or wireless) from fuel cell stacks contained within a hot box 13 shown in FIG. 4. The air-cooled electronics module 2 may further include an electrical output 17. The electrical output 17 may include electrical connections (wired or wireless) leading to another component of the fuel cell system, such as, for example, an input/output module 14 shown in FIG. 5 or a power conditioning module 18 shown in FIG. 5. The air-cooled electronics module 2 may include one or more electrical connections 37 (wired or wireless) connecting various electronic components, such as, for example, the DC/DC converter 3A, the control circuit 3B, the transformer 7, and/or the inductor 9.

Fuel Cell Module Cabinet

Figure 3:
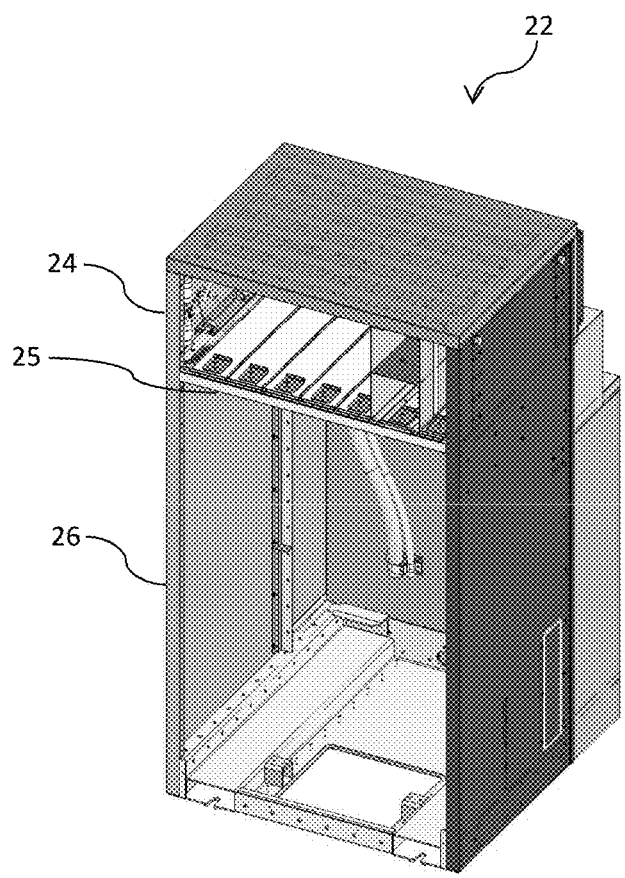
FIG. 3 depicts a three dimensional view of a fuel cell module cabinet with electronics and other components removed according to the present disclosure.

FIGS. 3 and 4 show examples of the fuel cell system module (e.g., power module) 100 including a fuel cell module cabinet 22. For illustrative purposes, FIG. 3 shows a three dimensional view of the fuel cell module cabinet 22 with other components of the fuel cell system module 100 removed. FIG. 4 shows a three dimensional view of the fuel cell module cabinet 22 with electronics and other components installed therein. The fuel cell module cabinet 22 provides separate air spaces for an electrical cabinet 24 (second compartment) and a fuel cell cabinet 26 (first compartment), wherein the electrical cabinet 24 may maintain a positive gauge pressure while the fuel cell cabinet 26 may maintain a negative gauge pressure. The fuel cell cabinet 26 and the electrical cabinet 24 may be provided in a common frame or housing of the fuel cell module cabinet 22. This design reduces the size of the fuel cell system module 100, allowing the fuel cell system module 100 to fit into small spaces for indoor applications, such as freight elevators and freight corridors. The fuel cell module cabinet 22 may include at least one wall or platform 25 separating the fuel cell module cabinet 22 into the fuel cell cabinet 26 and the electrical cabinet 24. FIGS. 3 and 4 show that the electrical cabinet 24 is stacked on top of the fuel cell cabinet 26. It is understood that in some examples, the electrical cabinet 24 may be provided below the fuel cell cabinet 26. In some examples, the fuel cell cabinet 26 and the electrical cabinet 24 may be arranged side by side.

The electrical cabinet 24 may be configured to contain one or more electronics module 2 shown in FIGS. 1-2. As shown in FIGS. 3 and 4, more than one electronics modules 2 may be disposed in more than one slots provided in the electrical cabinet 24. The fuel cell cabinet 26 may be configured to contain one or more other fuel cell system electronics, such as, one or more power generation components. The one or more power generation components may include a hot box 13 containing one or more fuel cell stacks and a balance of plant (BOP) sub-system 27 including blowers, valves, and control boards, etc. FIG. 4 also shows that the each electronics module 2 may include more than one fan 8 (e.g., three fans).

Fuel Cell System

Figure 5:
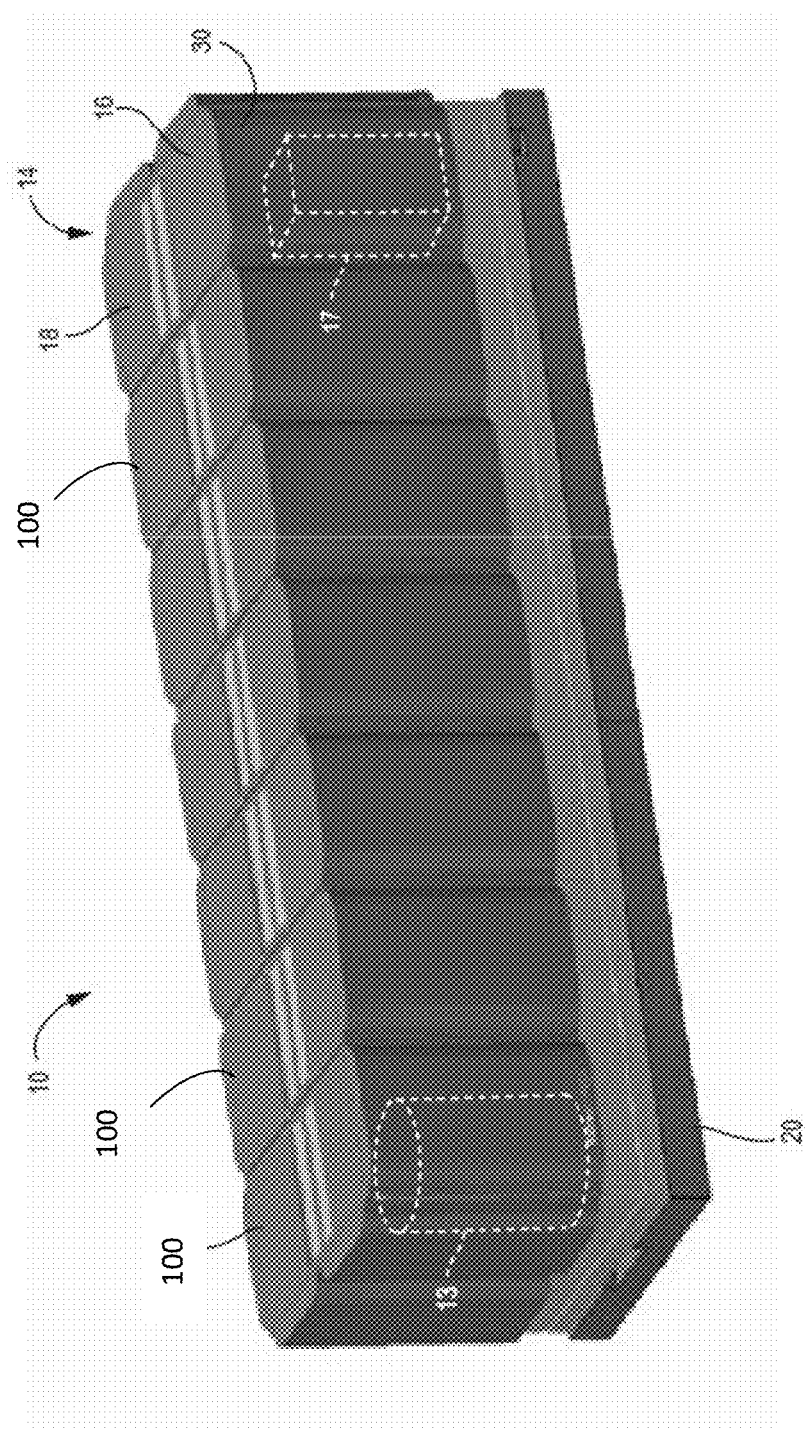
FIG. 5 is an isometric view of a fuel cell system according to the present disclosure.

FIG. 5 shows a fuel cell system 10 according to the present disclosure. The fuel cell system 10 may contain fuel cell modules and components described in U.S. patent application Ser. No. 11/656,006, filed on Jan. 22, 2007, and U.S. Pat. No. 8,440,362 B2, issued on Sep. 23, 2011, the contents of which are expressly incorporated herein by reference in their entireties. The fuel cell system 10 may be modular, i.e., it may include one or more fuel cell system modules 100 and other modules. The modular fuel cell system 10 may allow for flexible system installations and operations. The modular fuel cell system 10 allows for flexible scaling of installed power-generating capacity. The modular fuel cell system 10 also increases reliability in power generation, and increases the flexibility of fuel processing and the flexibility of power output voltages and frequencies with a single design set. The modular design results in an "always on" unit with high availability and reliability. For example, when one fuel cell system module 100 is taken off line (e.g., for maintenance, repair, or replacement), other fuel cell system modules 100 may not be affected, and may continue to operate. The modular design also provides an easy means of scaling to meet specific requirements of customers' installations. For example, when power demand increases, the modular design makes it easy to increase the number of fuel cell system modules 100 to generate more power. The modular design also allows the use of available fuels and required voltages and frequencies, which may vary by customer and/or by geographic region.

The fuel cell system 10 may include one or more fuel cell system modules 100 described above with respect to FIGS. 3-4. The fuel cell system 10 may also include one or more fuel processing (or fuel input) modules 16. The fuel cell system 10 may include one or more power conditioning (e.g., electrical output) modules 18. The fuel cell system modules 100 may be electrically and/or fluidly connected with at least one of the fuel processing module 16 or the power conditioning module 18 through wires, cables, and/or conduits provided within the fuel cell system 10, e.g., in the base 20. For example, the fuel cell system module 100 may be electrically connected with the power conditioning module 18 and/or the fuel processing module 16 through wires provided in the base 20. The fuel cell system module 100 may be fluidly connected with the fuel processing module 16 through fluid conduits (e.g., pipes) provided in the base 20, and may receive fuel, such as de-sulfurized fuel, from the fuel processing module 16.

The power conditioning module 18 may be configured to deliver direct current (DC), alternating current (AC), or both. The power conditioning module 18 may include a mechanism to convert DC to AC, such as an inverter. The fuel cell system 10 may include any number of fuel cell system modules, such as 2-30 fuel cell system modules 100. For example, the fuel cell system 10 shown in FIG. 5 includes six fuel cell system modules 100 (arranged side by side in a row), one fuel processing module 16, and one power conditioning module 18. The fuel cell system module 100, fuel processing module 16, and power conditioning module 18 may be disposed on a common base 20. Base 20 may also provide a common space for wiring cables, power lines, conduits that may connect the fuel cell system modules 100 with the fuel processing module 16 and/or the power conditioning module 18. Each of fuel cell system modules 100, fuel processing module 16, and power conditioning module 18 may include its own cabinet. Alternatively or additionally, as will be described in more detail below, the fuel processing module 16 and the power conditioning module 18 may be combined into a single input/output module 14 disposed in one cabinet.

Each of the fuel cell system modules 100 include the fuel cell module cabinet 22, which may be separated into the electrical cabinet 24 and the fuel cell cabinet 26. The fuel cell cabinet 26 may be configured to house at least one hot box 13. Each hot box 13 may contain one or more stacks or columns of fuel cells (not shown for clarity), such as, for example, one or more stacks or columns of solid oxide fuel cells having a ceramic oxide electrolyte separated by conductive interconnect plates. Other fuel cell types, such as Proton Exchange Membrane (PEM), molten carbonate, phosphoric acid, etc., may also be included in the hot box 13. The fuel cell stacks may include externally and/or internally manifolded stacks. For example, the fuel cell stacks may be internally manifolded for fuel and air with fuel and air risers extending through openings in the fuel cell layers and/or in the interconnect plates between the fuel cells.

Alternatively or additionally, the fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, issued on May 11, 2010, the content of which is expressly incorporated herein by reference in its entirety. The fuel cells may have different fuel/air flow configurations. For example, each fuel cell may have a cross flow configuration (where air and fuel flow roughly perpendicularly to each other on opposite sides of the electrolyte in each fuel cell), a counter flow parallel configuration (where air and fuel flow roughly in parallel to each other but in opposite directions on opposite sides of the electrolyte in each fuel cell), and/or a co-flow parallel configuration (where air and fuel flow roughly in parallel to each other in the same direction on opposite sides of the electrolyte in each fuel cell).

The fuel processing module 16 may include a cabinet which contains components used for pre-processing a fuel, such as, for example, adsorption beds (e.g., de-sulfurizer and/or other impurity adsorption beds). The fuel processing module 16 may be configured to process different types of fuels. For example, the fuel processing module 16 may include at least one of a diesel fuel processing module, a natural gas fuel processing module, or an ethanol fuel processing module in the same cabinet or in separate cabinets. A different bed composition tailored for a particular fuel may be provided in each fuel processing module 16. The fuel processing module 16 may process at least one of the following fuels: natural gas provided from a pipeline, compressed natural gas, methane, propane, liquid petroleum gas, gasoline, diesel, home heating oil, kerosene, JP-5, JP-8, aviation fuel, hydrogen, ammonia, ethanol, methanol, syngas, bio-gas, bio-diesel and other suitable hydrocarbon or hydrogen containing fuels. In some examples, a reformer 17 may be included in the fuel processing module 16. In some examples, the reformer 17 may be thermally integrated with the fuel cell stack(s). In such examples, a separate reformer 17 may be disposed in each hot box 13 in a respective fuel cell system module 100. In some examples, if internally reforming fuel cells are used, an external reformer 17 may be omitted. The fuel processing module 16 may be fluidly connected with the one or more fuel cell system modules 100, e.g., via conduits provided in the base 20, to provide processed fuel (e.g., de-sulfurized fuel) to the one or more fuel cell system module 100.

The power conditioning module 18 may include a cabinet that contains components for converting DC power generated by a fuel cell stack including in the fuel cell system module 100 to AC power (e.g., DC/DC and DC/AC converters described in U.S. Pat. No. 7,705,490, issued Apr. 27, 2010, the content of which is expressly incorporated herein by reference in its entirety), electrical connectors for AC power output to a power grid, circuits for managing electrical transients, a system controller (e.g., a computer or dedicated control logic device or circuit). The power conditioning module 18 may be configured to convert DC power from the fuel cell modules to different AC voltages and frequencies. Designs for 208V, 60 Hz; 480V, 60 Hz; 415V, 50 Hz and other common voltages and frequencies may be provided. The power conditioning module 18 may be electrically connected with the one or more fuel cell system modules 100, e.g., via wires provided in the base 20, to provide power to the fuel cell system modules 100 and receive power generated by the fuel cell system modules 100.

Referring to FIG. 5, in some examples, the fuel processing module 16 and the power conditioning module 18 may be housed in one single input/output module 14 with a common cabinet. When a single input/output module 14 is provided, the fuel processing module 16 and the power conditioning module 18 may be disposed vertically (e.g., power conditioning module 18 may be stacked above or below the fuel processing module 16 de-sulfurizer canisters/beds) or side by side with one another within the single input/output module 14.

As shown in FIG. 5, one input/output module 14 may be provided for one row of six fuel cell system modules 100, which are arranged linearly side by side on one side of the input/output module 14. The row of fuel cell system modules 100 may be positioned, for example, adjacent to a building for which the fuel cell system 10 provides power. While one row of fuel cell system modules 100 is shown in FIG. 5, the fuel cell system 10 may include more than one row of fuel cell system modules 100. For example, the fuel cell system 10 may include two or more rows of fuel cell system modules 100 stacked back to back, end to end, side by side, or stacked one onto the other.

The fuel cell system 10 is readily scalable. For example, any suitable number of fuel cell system modules 100 may be provided in the fuel cell system 10 based on the power needs of the building or other facility serviced by the fuel cell system 10. The fuel cell system modules 100 and the input/output module 14 may also be provided in other ratios. For example, in some examples, more than six or less than six fuel cell system modules 100 may be provided adjacent to one input/output module 14. Further, the fuel cell system 10 may include more than one input/output module 14 (e.g., two input/output modules 14 each containing a separate fuel processing module 16 and a separate power conditioning module 18). Although in the example shown in FIG. 5, the input/output module 14 is disposed at the end of the row of fuel cell system modules 100, the input/output module 14 may also be disposed at other location of the fuel cell system 10, such as, for example, in the center of the row of fuel cell system modules 100. Depending on the customer's specification (e.g., demand of power), one or more fuel cell system modules 100 may be added to the fuel cell system 10, or one or more fuel cell system modules 100 may be shut down or removed from the fuel cell system 10.

The fuel cell system 10 may be configured in a way to ease servicing of the system. The routinely serviced components (such as the consumable components) may be placed in a single module to reduce the amount of time for service. For example, a purge gas and de-sulfurizer material for a natural gas fueled system may be placed in a single module (e.g., the fuel processing module 16 or the combined input/output module 14). A service person may only need access a single module or cabinet to service the components during routine maintenance. Thus, each of fuel cell system modules 100, input/output module 14, fuel processing module 16, and power conditioning module 18 may be serviced, repaired, or removed from the fuel cell system 10 without opening the other modules or cabinets and without servicing, repairing, or removing the other modules or cabinets.

For example, as described above, the fuel cell system 10 may include multiple fuel cell system modules 100. In some examples, when at least one fuel cell system module 100 is taken off line (e.g., no power is generated by the stacks in the hot box 13 included in the fuel cell system module 100), the remaining fuel cell system modules 100, the fuel processing module 16, and the power conditioning module 18 (or the combined input/output cabinet 14) may not be affected, and may continue to operate to generate power. Furthermore, the fuel cell system 10 may contain more than one of each type of module 100, 14, 16, or 18. In some examples, when at least one module of a particular type is taken off line, the remaining modules of the same type may not be affected, and may continue to operate.

In some examples, in a fuel cell system 10 including a plurality of modules or cabinets, each of the modules 100, 14, 16, or 18 may be electrically disconnected individually, removed individually from the fuel cell system 10, and/or serviced or repaired individually without affecting the operation of the other modules in the fuel cell system 10, allowing the fuel cell system 10 to continue to generate electricity. The entire fuel cell system 10 may not have to be shut down if one stack of fuel cells in one hot box 13 malfunctions or is taken off line for servicing.

Door

Because of the significant size of the fuel cell stack hot boxes, large stationary fuel cell system cabinets have large cabinet doors. The doors may be one to three meters tall by one to three meters wide and made of metal, such as steel or aluminum. The large dimension of the door results in higher mechanical loading requirements on the cabinet, increased door weight, and increased difficulty of handling the doors. Furthermore, the large doors require a large amount of wasted stand-off space between each cabinet and an adjacent structure (e.g., a building, another cabinet, etc.) to allow the side hinged door to swing open/close.

A conventional door opening mechanism (such as a left or right-sided hinged mechanism) would leave the opened door in a position that could hinder access to the inside of the cabinet, especially in a narrow space, such as an alley, or leave the door in a position that could expose it to damage from other doors or equipment. Furthermore, hinging a door from the side could contribute to door-sag from its own weight and dimensions. An additional issue faced when designing a fuel cell cabinet for outdoor operation is the integrity of the weather seal at each door interface. The seal must be positively assured in order to eliminate the reliability impact of water and foreign material entry to the cabinet.

Furthermore, the doors may be constructed from many parts due to the multiple functions that a door performs, such as protecting the fuel cell hot box 13 from the environment, providing a thermal barrier between the outside of the hot box 13 and the ambient, housing the air filters, providing mounting locations for latches, hinges, and seals, etc. The large amount of parts may impact the quality and placement accuracy of the door.

Figure 6:
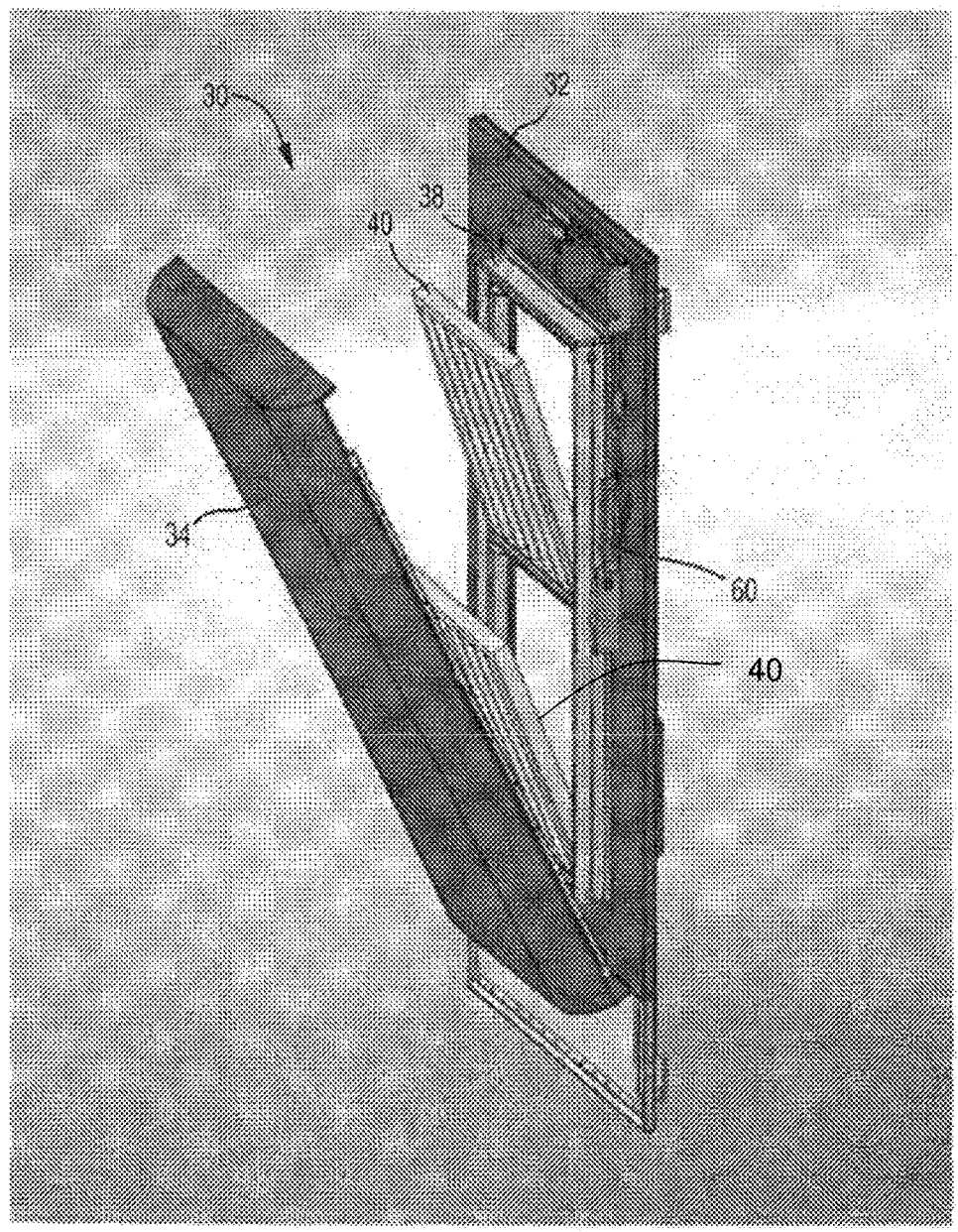
FIG. 6 is an isometric view of a door that may be used in the fuel cell system in an open state according to the present disclosure.

FIG. 6 shows an isometric view of a door 30 that may be used in the fuel cell system 10 in an open state. The door 30 may be included in the fuel cell system module 100, the fuel processing module 16, the power conditioning module 18, and/or input/output module 14. When used in the fuel cell system 100, the door 30 may be attached to the fuel cell module cabinet 22. The door 30 may be a hatch, an access panel, etc., which may allow the internal components of the respective module to be accessed (e.g., for maintenance, repair, replacement, etc.). In one example, the fuel cell system module 100 and the input/output module 14 are arranged in a linear array that has one or more doors 30 only on one face of each module, allowing a continuous row of systems to be installed abutting each other at the ends. Thus, the fuel cell system module 100 and the input/output module 14 may have doors facing a direction perpendicular to an axis of the module row. In this way, the size and capacity of the fuel cell system 10 may be adjusted, e.g., with additional fuel cell system module(s) 100, input/output module(s) 14, and base(s) 20 with minimal rearrangement of the existing fuel cell system module(s) 100, input/output module 14, and base 20. In some examples, the door 30 to the input/output module 14 may be attached to a side end rather than on a front end of the input/output module 14.

In some examples, the door 30 may include at least one inner portion 32 and at least one outer portion 34. The inner portion 32 forms a framework for the door 30 and includes features to allow the door 30 to be coupled to the fuel cell module cabinet 22 or a frame of the input/output module 14. The outer portion 34 may be coupled to the inner portion 32 and may provide a cover for the door 30. In some examples, the outer portion 34 may include a polymeric material and the inner portion 32 may include a metal material. By forming the outer portion 34 of the door 30 at least partially with polymeric components, the building and painting costs, overall weight, and exterior heat loading may be reduced and the dent resistance of the door 30 can be increased. Flame resistance per UL 746C may be included in the material of the outer portion 34 when needed for specific applications.

In some examples, the entire door 30 is injection molded as a single structure. The injection molded door 30 may incorporate as many features as possible to reduce total part count, provide mounting points, and simplify production of high quality parts. A mold for such a molded door may be configured to allow two different plastics to be co-injected into the same mold, such that the inner side of the door (i.e., the side which faces into the cabinet when closed) is made from a heat and flame resistant plastic sheet, while the outer side of the door is made from a plastic sheet that is weather resistant and aesthetically pleasing without possessing the flame and high temperature resistance. In some examples, the door 30 may be formed with a vacuum thermoforming process. A sheet may first be formed with co-extrusion of two or more plastics that meet UL and cosmetic requirements. The co-extruded sheet may then be vacuum thermoformed to form the door 30.

Because high temperature fuel cells (e.g. SOFCs) operate at high temperatures, the door 30 may be formed to have materials or features that increase the flame resistance of the door 30. If there is no risk of flame or extreme heat exposure, then a standard, low cost, color plastic material may be used to form the door 30. If there is a low risk of flame, additives may be mixed with the standard plastics while maintaining exterior quality of the door 30. For example, co-injection may be used to mold the exterior (e.g., the outer portion 34) using the standard plastics and the interior (e.g., the inner portion 32) using the required UL746C flame resistant plastics. A single, co-injection mold with inserts to allow for needed features may be used to form the door 30. In some examples, when flame resistance is needed per UL746C, the door 30 may feature another type of flame retardant feature on its surface. For example, a flame retardant coating may be added to an inner surface (i.e., the surface facing the inner portion 32) of the outer portion 34. As another example, a separate, flexible flame retardant layer such as cloth may be provided over the inner surface of the outer portion 34. As yet another example, a separate, rigid flame retardant layer, such as an extruded flat plastic, may be added to the inner surface of the outer portion 34. In some examples, various flame retardant materials may be used in combination with one another.

The outer portion 34 may be molded or otherwise formed from a polymer in a variety of colors, eliminating the need for painting. In one example, a substantial portion of the outer portion 34 is made of the polymer material. The outer portion 34 including the polymer may be dent resistant and graffiti resistant. The outer portion 34 including the polymer may be scratch resistant and any scratch that occurs may be less visible than a similar scratch on a metal body and may not cause associated corrosion problems. Further, the outer portion 34 may include additional parts and features that are integrally molded, such as filter housings and fasteners to facilitate easier, faster, more accurate assembly of the door 30 and installation of the door 30. The outer portion 34 including the polymer may reduce costs, labor, and material needed for construction of the door 30. Forming the outer portion 34 with a process such as injection molding allows for better fit and easier assembly of the door 30. A polymer material is lighter than a corresponding part formed of a metal material. A door 30 including a polymer material in the outer portion 34 allows for easier handling, lifting, and shipping.

Figure 7A:
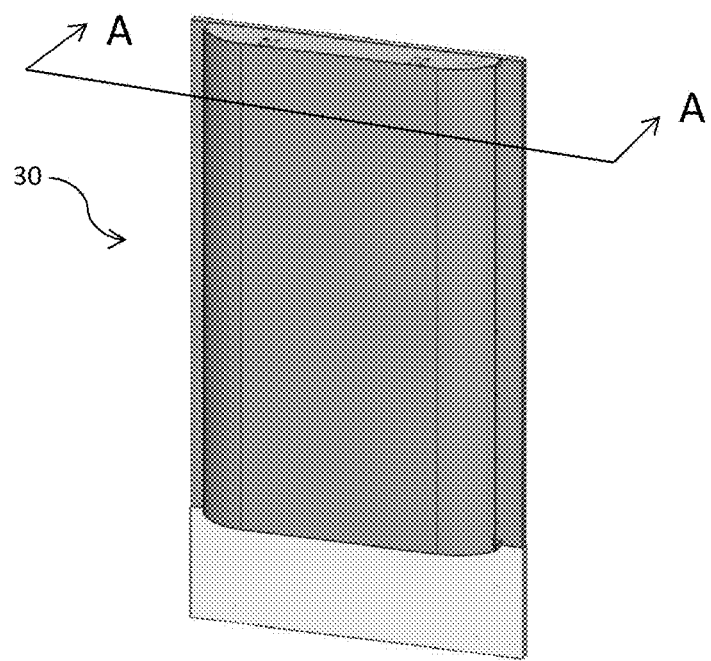
FIG. 7a depicts an exterior view of a door that may be used in the fuel cell system according to the present disclosure.
Figure 7B:
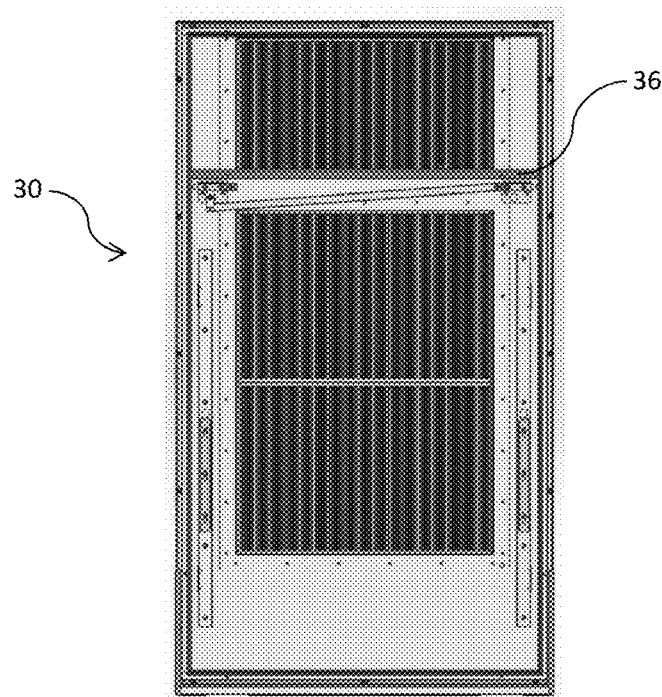
FIG. 7b depicts an interior view of a door that may be used in the fuel cell system according to the present disclosure.

FIG. 7*a* depicts an exterior view of a door that may be used in the fuel cell system 10 according to the present disclosure. FIG. 7*b* depicts an interior view of a door that may be used in the fuel cell system 10 according to the present disclosure. To keep separate air spaces for the electrical cabinet 24 and the fuel cell cabinet 26, the door 30 may include a protruding portion 36 extending between the electrical cabinet 24 and the fuel cell cabinet 26. This separation allows the electrical cabinet 24 to maintain a positive gauge pressure while the fuel cell cabinet 26 maintains a negative gauge pressure. The protruding portion 36 may protrude into the space with a suitable portion (full, half, one third, etc.) of the depth of the fuel cell module cabinet 22. The door 30 may be used as a door for the fuel cell module cabinet 22 and/or the fuel processing module 16, power conditioning module 18, or the input/output module 14 that may contain the fuel processing module 16 and the power conditioning module 18.

Filter Assembly

Fuel cell system cabinets generally include filtration systems to filter incoming cooling air that passes through the cabinets. In high-dust environments, multi-layered filters can quickly become clogged and require frequent changes.

Pneumatic back flush filters only work when the air intake is shut down and generally do not work well in always-on fuel cell systems. Water curtain filters, in which a curtain of falling water removes particles form air passing through the water, requires power and water flow, which complicates the operation of the system. Such systems require a water filter for a closed system or a constant water supply for open systems.

Figure 8:
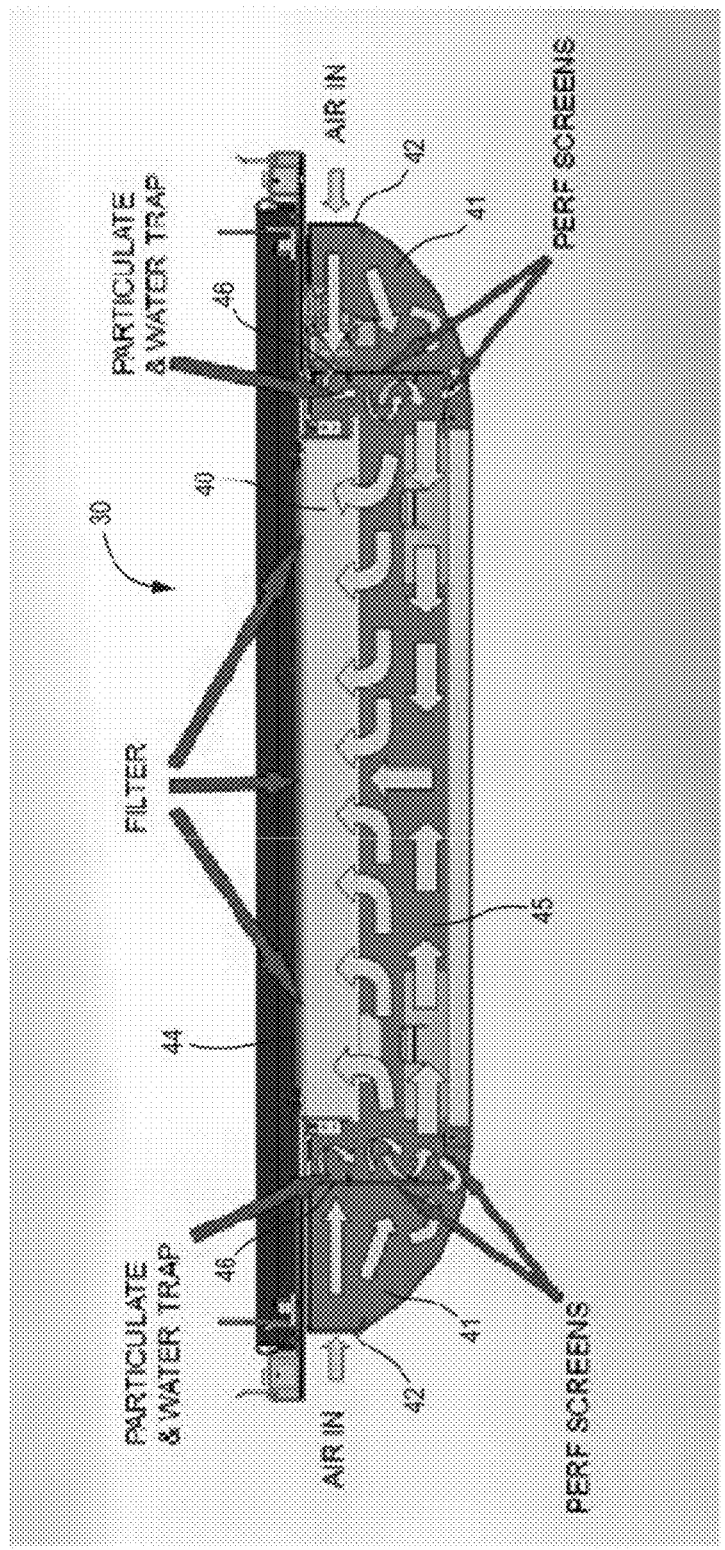
FIG. 8 is a cross-section view of a door that may be used in the fuel cell system, taken along line A-A in FIG. 7a, showing an airflow through the door according to the present disclosure.

The door 30 may include one or more air filtration devices as shown in FIG. 6. The air filtration devices may include air filters, screens, membranes, and other air cleaning components. In some examples, the door 30 may include at least one air filtration device in a space between the inner portion 32 and the outer portion 34. For illustrative purposes, in the example shown in FIG. 6, two air filters 40 are disposed over each other in the space between the inner portion 32 and the outer portion 34 of the door 30. FIG. 8 is a cross-section view of the door 30 taken along line A-A in FIG. 7a, showing an airflow through the door 30 according to the present disclosure. As shown in FIG. 8, the left and/or right edge of the door 30 may include an air inlet 42 configured to allow air to flow from the atmosphere to the space between the inner portion 32 and the outer portion 34 where the air filters 40 are disposed. The air passes through the air filters 40, which filter foreign material (e.g., dust, dirt, etc.) from the air. The filtered air is then provided to the interior of the fuel cell module cabinet 22 (e.g., to the fuel cell cabinet 26 and/or the electrical cabinet 24) through an outlet 44 located in the inner portion 32 of the door 30. The air filters 40 may be provided between the inlets(s) 42 and the outlet 44. The filtered air may act as the inlet air stream that is blown into the fuel cell stacks disposed in the hot box 13 by an air blower disposed in the fuel cell module cabinet 22.

The door 30 may further include other air filtration devices, such as a rough or initial filtering mechanism. The initial filtering mechanism may include one or more perforated screens 46, as shown in FIG. 8, which may filter particulate and water/moisture from the air. The perforated screens 46 may be disposed in the air flow path between the air inlet 42 and the air filters 40. Each screen 46 may have an "L" shape when viewed from the top of the door 30. By pre-filtering the incoming air, the door 30 reduces the amount of dust and other particulates fouling the air filters 40.

As shown in FIG. 8, air (shown by arrows) enters from one or more door sides (e.g., left and/or right edge surfaces of the door 30) through the inlets 42 and enters an expansion chamber 41 located between the inlets 42 and the screen 46. The expansion chamber 41 may be part of the inner space between the inner portion 32 and the outer portion 34. In some examples, the width of the expansion chamber 41 may be larger than that of the adjacent inlets 42. This allows the air to expand and slow down in the expansion chamber 41. As the air slows down, dirt, dust, and other particulate matter suspended in air are allowed to drop down to the bottom of the expansion chamber 41 prior to reaching the perforated screens 46. The air then passes through the perforated screens 46 and enters an inner cavity 45 between the inner portion 32 and the outer portion 34 where the air further flows to the plenum in front of the air filter 40. The inner cavity 45 may be part of the inner space between the inner portion 32 and the outer portion 34. The screens 46 may also create turbulence in the air flow. When the air flow becomes more turbulent and turns abruptly, entrained and suspended particulates that pass through the perforated screens 46 are caused further to drop out of the air. Air with reduced foreign material then passes through air filter 40. The air filter 40 creates an inner vertical baffle. In one example, the air filter 40 provides final filtration. Filtered air enters the cabinet through the outlet 44 in the inner portion 32 of the door 30.

The outer portion 34 of the door 30 may be configured to be hinged outward relative to the inner door 32 (as shown in FIG. 6) to aid in quick and easy servicing of the air filters 40 and/or other filtration devices. The hinge may be disposed at the bottom of the frame of the door 30 such that the outer portion 34 of the door 30 swings downward to expose the air filters 40 and/or other filtration devices for maintenance without opening the inner portion 32 of the door 30 to expose the inside of the fuel cell system module 100 or input/output module 14. Thus, the air filters 40 and/or the screens 46 may be serviced or replaced without opening the entire door 30 to the cabinet of the fuel cell system module 100 or the input/output module 14.

As shown in FIG. 6, the door 30 may include one or more frame members 38 holding the air filters 40. The frame members 38 may be configured to pivot outward or to allow only the air filters 40 to pivot outward as shown in FIG. 6. The frame members 38 and/or the air filters 40 may be configured to pivot outward using a pivot located on the bottom end of the frame members 38. The frame members 38 and/or the air filters 40 may be configured to automatically pivot outward when the outer portion 34 of the door 30 is pivoted outward. Alternatively, the frame member 38 and/or the air filters 40 may be pivoted outward manually by a human operator or a machine after the outer portion 34 of the door 30 is pivoted outward. The servicing of the air filters 40 may be performed without breaking the water-tight seal of the inner portion 32 of the door 30. For example, to service the air filters 40, the outer door portion 34 may be tilted away, and the air filters 40 may be lifted out and replaced. After the air filters 40 are replaced, the outer portion 34 is closed by being swung upwards to be latched to the inner portion 32 of the door 30, as shown in FIG. 6.

The shape of the inlets 42 on the door 32 is configured such that the air inlet area is not directly visible from the front of the door 30 and the front of the fuel cell system module 100 or the input/output module 14, thereby improving the aesthetic of the appearance of the fuel cell system 10. In some examples, the inlets 42 may extend along the full vertical left and right edges of the door 30. Inlet pressure drop may be diminished, reducing the parasitic power draw of the fuel cell system 10. In some examples, the inlets 42 may be located on one of or both of the left and right sides of the door 30. When there is a systematic bias in environmental foreign material (e.g., snow, sand drifts, or other debris being blown to the door 30 from one direction), one of the two sides may effectively be in the "lee" (i.e., downstream) of the oncoming wind without being significantly affected by foreign materials, allowing the unit to operate without obstruction even in severe storm conditions.

The configuration of the door 30 as shown in FIG. 8 has several non-limiting advantages. The air passing through the door 30 is significantly cleaner before it even first enters the air filters 40 than conventional doors. No direct power is consumed to perform the first-stage foreign material removal by using the passive filtering of the air as described above. By reducing the amount of foreign materials that reach the air filters 40, the frequency with which the air filters 40 has to be changed is reduced. By extending the life of the air filters 40, secondary costs due to service personnel visits and filter consumables are considerably reduced for the fuel cell system 10.

Passive Air Intake Louver

Figure 9:
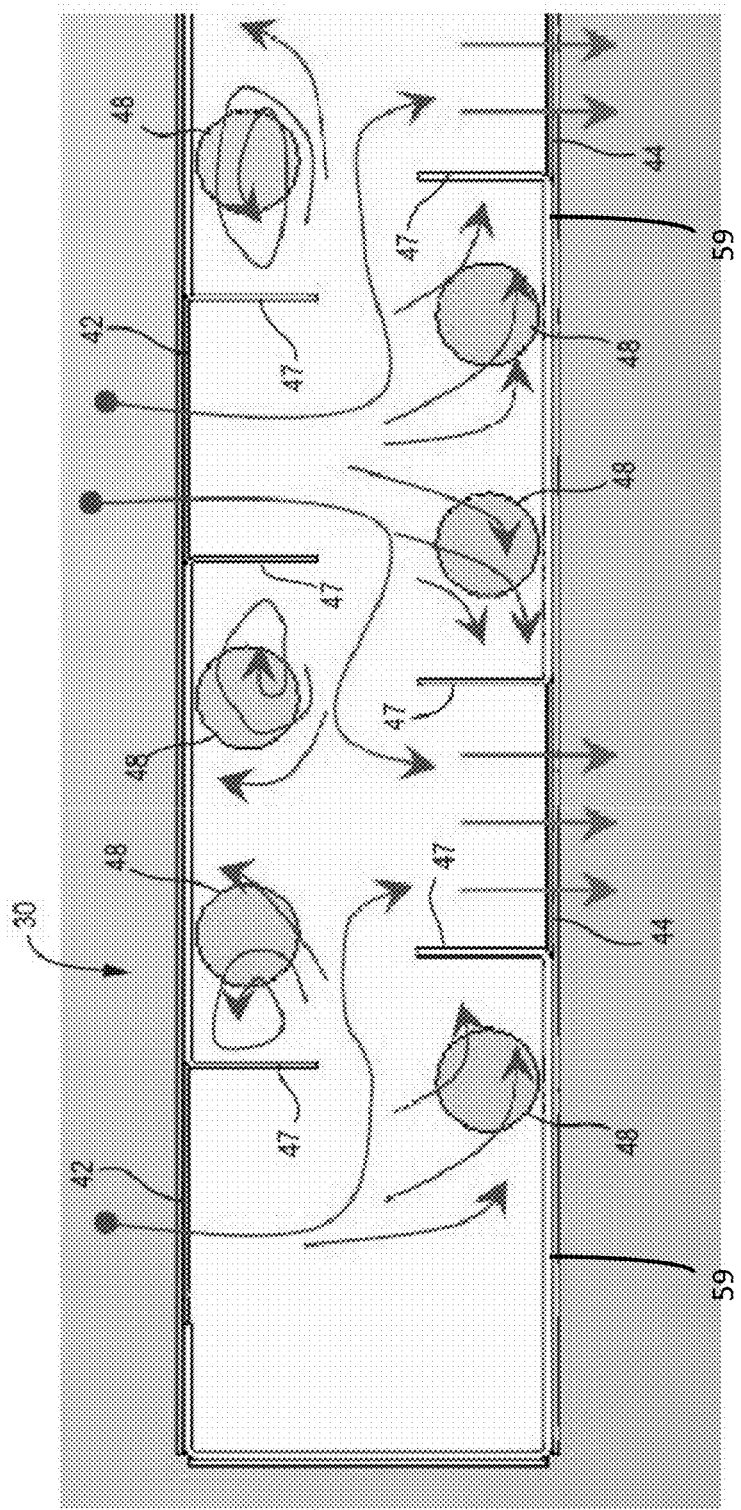
FIG. 9 is a schematic cross-section view of a door that may be used in the fuel cell system, taken along line A-A of FIG. 7a, showing an airflow through the door according to the present disclosure.

FIG. 9 is a schematic cross-section view of the door 30 that may be used in the fuel cell system 10, taken along line A-A of FIG. 7a, showing an airflow through the door 30 according to the present disclosure. FIG. 9 shows that the door 30 may contain a passive air intake louver 59 located within the space between the inner portion 32 and the outer portion 34 of the door 30. The passive air intake louver 59 may include a plurality of internal baffles 47 protruding toward the space between the inner portion 32 and the outer portion 34. The space serves as an air flow path, and the baffles 47 are located within the air flow path. The baffles 47 may cause the air flow from the inlet(s) 42 to change its flow direction, e.g., at least 2 times, inside the inner space before reaching the outlet 44. The internal baffles 47 may be formed, for example, with offset opposing rows of c-channels coupled to the inside of the door 30.

The baffles 47 may take any form or shape, such as, for example, strips, rods, plates, or rails. The baffles 47 may be alternatively attached to the inner portion 32 and/or the outer portion 34 of the door 30, in a roughly interdigitated arrangement (e.g., with baffles attached to opposite portions 32 and 34 of the door 30 overlapping or not overlapping in the door thickness direction). The baffles 47 may extend through the entire or a portion of the vertical height of the door 30. The baffles 47 may be arranged in any suitable configuration which substantially prevents the air stream flowing from the inlet 42 from travelling in a straight line to the outlet 44. Instead, the baffles 47 are configured to direct the air stream to travel a serpentine path from the inlet 42 to the outlet 44.

The foreign material (dust, sand, mist, etc.) in the air stream has momentum which causes it to continue moving forward while the air changes direction around the baffles 47. The dust and sand collect in the corners (e.g., at the upstream baffle surface) formed by the baffles 47 and drain out of the door through one or more openings 48 disposed at the bottom of the door 30. Air with significant reductions of dust and dirt exits the louver assembly through outlet 44.

The air intake louver 59 of FIG. 9 may be used together with the screen 46, the expansion chamber 41, and/or the air filter(s) 40 shown in FIG. 8. In some examples, the air passes from the inlet 42 through the expansion chamber 41 and/or the screen 46 before reaching the baffles 47 of the air intake louver 59. The air then passes from the air filter(s) 40, as shown in FIGS. 6 and 8 and into the fuel cell system module 100 or the input/output module 14 through the outlet 44 in the door 30. Alternatively or additionally, the air intake louver 59 may be present in a door 30 that does not include at least one of the screen 46, the expansion chamber 41, or the air filter(s) 40 shown in FIG. 8.

FIG. 9 depicts two sets of air intake louver 59 structures with air entering from two inlets 42 on left and right sides of the door 30. In some examples, more or less than two sets of air intake louver 59 structures may be provided in the door 30 at periodic or irregular, random intervals. In some examples, more than two inlets 42 may be provided in the door 30. Furthermore, while the inlets 42 are shown in the outer portion 34 of the door 30 in FIG. 9, additionally or alternatively, the inlets 42 may be located in the side (i.e., edge) of the door 30 as shown in FIG. 8.

Door Assembly

Figure 10:
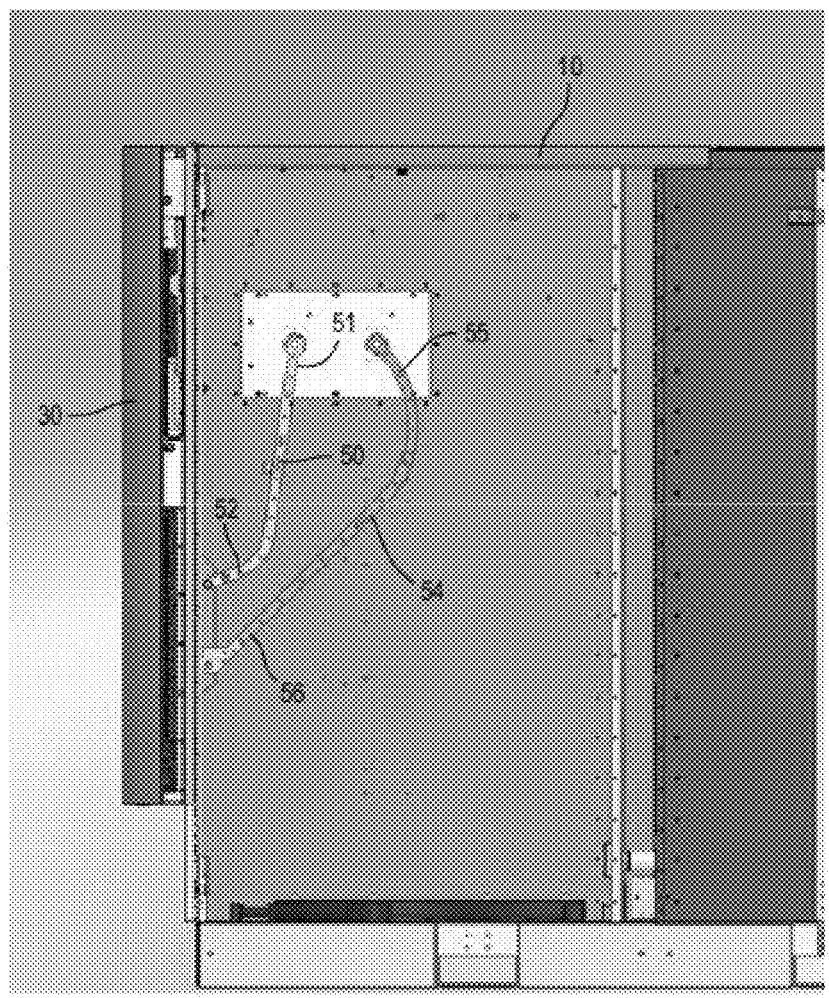
FIG. 10 is a side view of a fuel cell system with the side wall removed, showing the door in a closed position according to the present disclosure.
Figure 11:
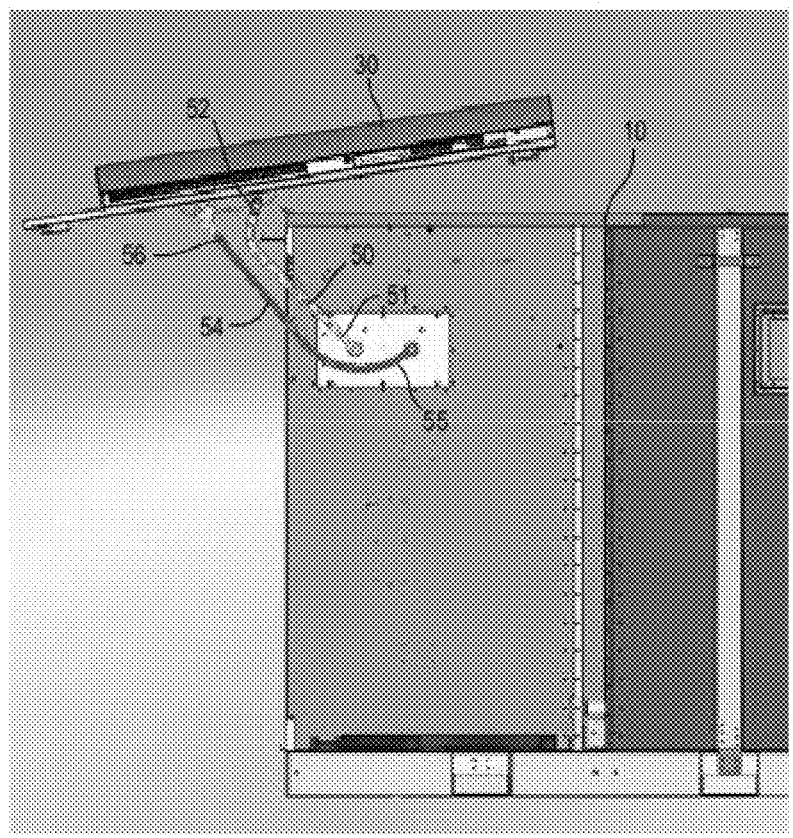
FIG. 11 is a side view of a fuel cell system with the side wall removed, showing the door in an open position according to the present disclosure.

FIG. 10 is a side view of the fuel cell system 10 with the side wall removed, showing the door 30 in a closed position according to the present disclosure. FIG. 11 is a side view of the fuel cell system 10 with the side wall removed, showing the door 30 in an open position according to the present disclosure. In some examples, the entire door 30, including both of the inner portion 32 and the outer portion 34, may be opened to access the interior of the fuel cell system 10, which includes the fuel cell system module 100 or the input/output module 14. In order to mitigate the door-sag which might result from the torque upon the door 30 when it is opened, door structures of large stationary generators are generally significantly reinforced with expensive and complex structural members.

Some conventional door panel configurations involve removable cabinet doors. With such designs, when a fuel cell system is being serviced, the door panel is removed and set to the side. In the case of large scale stationary fuel cell generators, removable doors are generally not employed because lifting off a large and heavy door assembly would generally require two field service personnel.

According to some examples of the present disclosure, as shown in FIGS. 10-11, the inner portion 32 and the outer portion 34 of the door 30 may be configured to open in tandem (e.g., together) with a substantially vertical and then substantially horizontal swing (e.g., "gull-wing" style). The door 30 opens by being moved up and then at least partially over the top of the fuel cell system 10 in a substantially horizontal direction. The terms "substantially vertical" and "substantially horizontal" include a deviation of 0 to 30 degrees, such as 0 to 10 degrees from exact vertical and horizontal directions, respectively.

As shown in FIGS. 10-11, the door 30 may be mounted onto at least one wall of the fuel cell system 10 with plural independent mechanical arms, such as two arms 50 and two arms 54. For example, the door 30 may be attached to a wall of the fuel cell module cabinet 22, a wall of the fuel processing module 16, a wall of the power conditioning module 18, and/or a wall of the input/output module 14 (which may contain the fuel processing module 16 and the power conditioning module 18). FIGS. 10-11 show one arm 50 and one arm 54 on the right side of the fuel cell system 10. The corresponding arms 50 and 54 on the left side of the fuel cell system 10 are obscured by the right side arms and thus not visible in the side views of FIGS. 10-11. Thus, in the non-limiting example, two arms 50 and 54 are provided on either side of the door 30 for a total of four arms.

The first arm 50 may include a first, substantially straight end 51 and a second, curved end 52. The second arm 54 may include a first, curved end 55 and a second, substantially straight end 56. It is understood that the first arm 50 and the second arm 54 may take other suitable shapes (straight or curved). The second arm 54 may be longer than the first arm 50 or vice versa. The second arm 54 may include a more pronounced curvature at one end. At least one of the first ends 51 and 55 may be coupled to an interior (or exterior) surface of a wall of the fuel cell system 10 at a fixed or adjustable distance relative to each other. For example, both of the first ends 51 and 55 may be coupled to an interior (or exterior) surface of a wall of the fuel cell module cabinet 22, a wall of the fuel processing module 16, a wall of the power conditioning module 18, and/or a wall of the input/output module 14 (which may contain the fuel processing module 16 and the power conditioning module 18). At least one of the second ends 52 and 56 may be coupled to the door 30 at a fixed or adjustable distance relative to each other. The first end 51 may be located closer to the door 30 than the first end 55. The second end 52 may be located above the second end 56 on the door 30.

The angle of attack for the door 30 as it is opening and closing may be adjusted by changing the location of the pivot points on the door 30 and/or on the fuel cell system 10.

In some examples, the angle of attack for the door 30 may be adjusted by adjusting the shape and/or length of the arms 50 and 54. A change in the vertical position when the door 30 is closed and horizontal position when the door 30 is opened may be adjusted by changing the location of the pivot points on the door 30 and/or on the fuel cell system 10. Alternatively or additionally, a change in the vertical position when the door 30 is closed and horizontal position when the door 30 is opened may be adjusted by adjusting the shape and/or length of the arms 50 and 54.

As shown in FIG. 11, in the open position, the arms 50 and 54 and biasing members (not shown) cooperate to hold the door 30 in a substantially horizontal orientation above the fuel cell system 10. The movement of the door 30 between the closed position (FIG. 10) and the open position (FIG. 11) as constrained by the arms 50 and 54 has several advantages over a conventionally side-hinged door. The hinge mechanism includes a relatively low number of parts. Site layout required (e.g., clearance required surrounding the fuel cell system 10) with the gull-wing door 30 is smaller than that required for a conventional side-hinged door of the same dimensions because of the shorter path traced by the door 30 as it opens compared to a longer path traced by a conventional side-hinged door. When closing the door 30, the user is aided by the gravity to overcome the force of the biasing members 58.

Further, in the open position shown in FIG. 11, the upper portion of the door 30 may be located over a top surface of the fuel cell system 10 (e.g., a top surface of the fuel cell module cabinet 22) and the lower portion of the door 30 may overhang the opening to the fuel cell system 10 (e.g., overhang an edge of the top surface). In this configuration, the door 30 has the advantage of providing rain and snow protection for a user/operator since the lower portion of the door 30 overhangs from the top surface of the fuel cell system 10. Alternatively or additionally, the entire door 30 may be located over the top surface of the fuel cell system 10 in the open position.

Positioning Hot Box in Fuel Cell System Module

The internal components of the fuel cell system module 100 may need to be periodically removed, such as to be serviced, repaired or replaced. Conventionally, the components, such as the hot box 13 and/or the balance of plant subsystem 27 are removed from the fuel cell system module 100 with a forklift. Conventional fuel cell assemblies may require substantial space on all sides to position a forklift and remove the components from an enclosure, sometimes as much as four to five times the length of the hot box 13.

Figure 12:
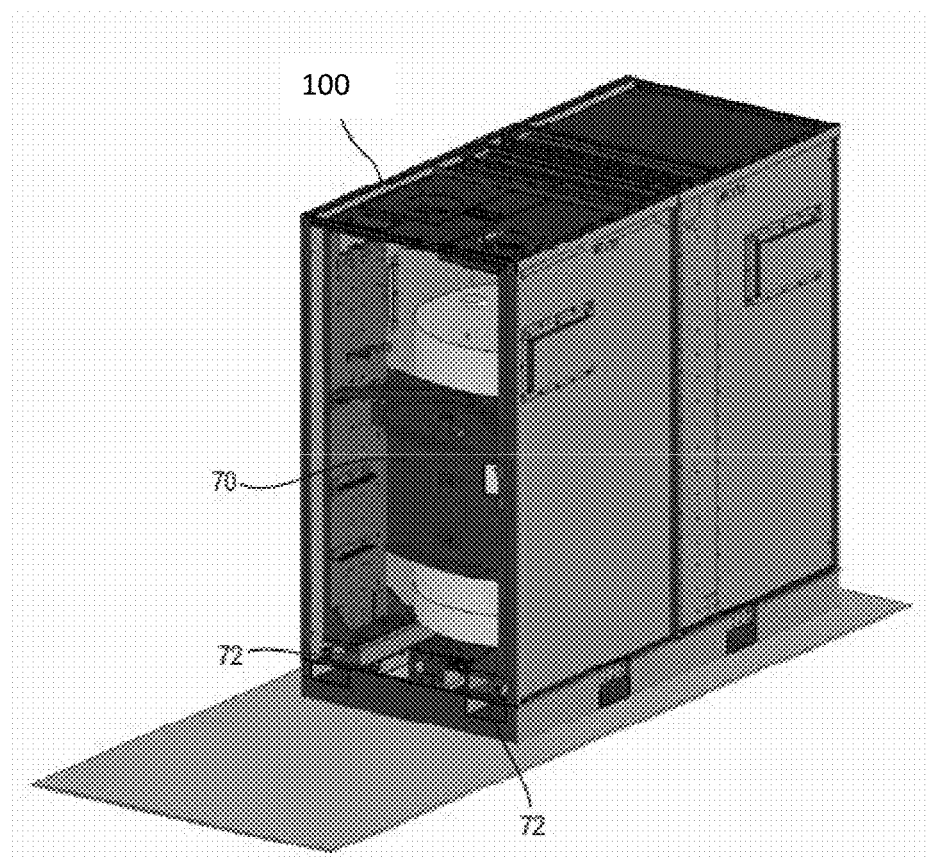
FIG. 12 is an isometric view showing a fuel cell system module including a field replaceable fuel cell module (FCM) with the door removed according to the present disclosure.

FIG. 12 is an isometric view showing a fuel cell system module 100 including a field replaceable fuel cell module (FCM) with the door 30 removed according to the present disclosure. As shown in FIG. 12, the fuel cell system module 100 may include a field replaceable fuel cell module (FCM) 70. The FCM 70 may include a hot box 13, such as a cylindrical hot box that may contain the fuel cell stacks and heat exchanger assembly, as well as a balance of plant (BOP) sub-system including blowers, valves, and control boards, etc. The FCM 70 may be mounted on a removable support 72, which allows the FCM 70 to be removed from the fuel cell system module 100 cabinet as a single unit. FIG. 12 shows a non-limiting example of a FCM 70 configuration where the FCM 70 includes a cylindrical hot box 13 and a frame which supports the BOP components. The hot box 13 and the frame are mounted on a common support, such as the removable support 72, which may be, for example, fork-lift rails. Other configurations may also be used. For example, the hot box 13 may have a shape other than cylindrical, such as spherical, cubic, prismatic, etc. The removable support 72 may include a platform rather than rails. The frame may have a different configuration or it may be omitted entirely with the BOP components mounted onto the hot box 13 and/or the removable support 72 instead. The FCM 70 is dimensionally smaller than the opening in the fuel cell system module 100 (e.g., the opening closed by the door 30). According to one example, the FCM 70 may be installed or removed from the cabinet of the fuel cell system module 100 as a single assembly. The FCM 70 may be coupled to the other components of the fuel cell system 10 using a minimal number of quick connect/disconnect mechanisms. For example, the FCM 70 may be connected to water conduits, fuel conduits, and bus bar conduits housed in the base 20 using quick connect/disconnect mechanisms in order to reduce servicing time.

Figure 13:
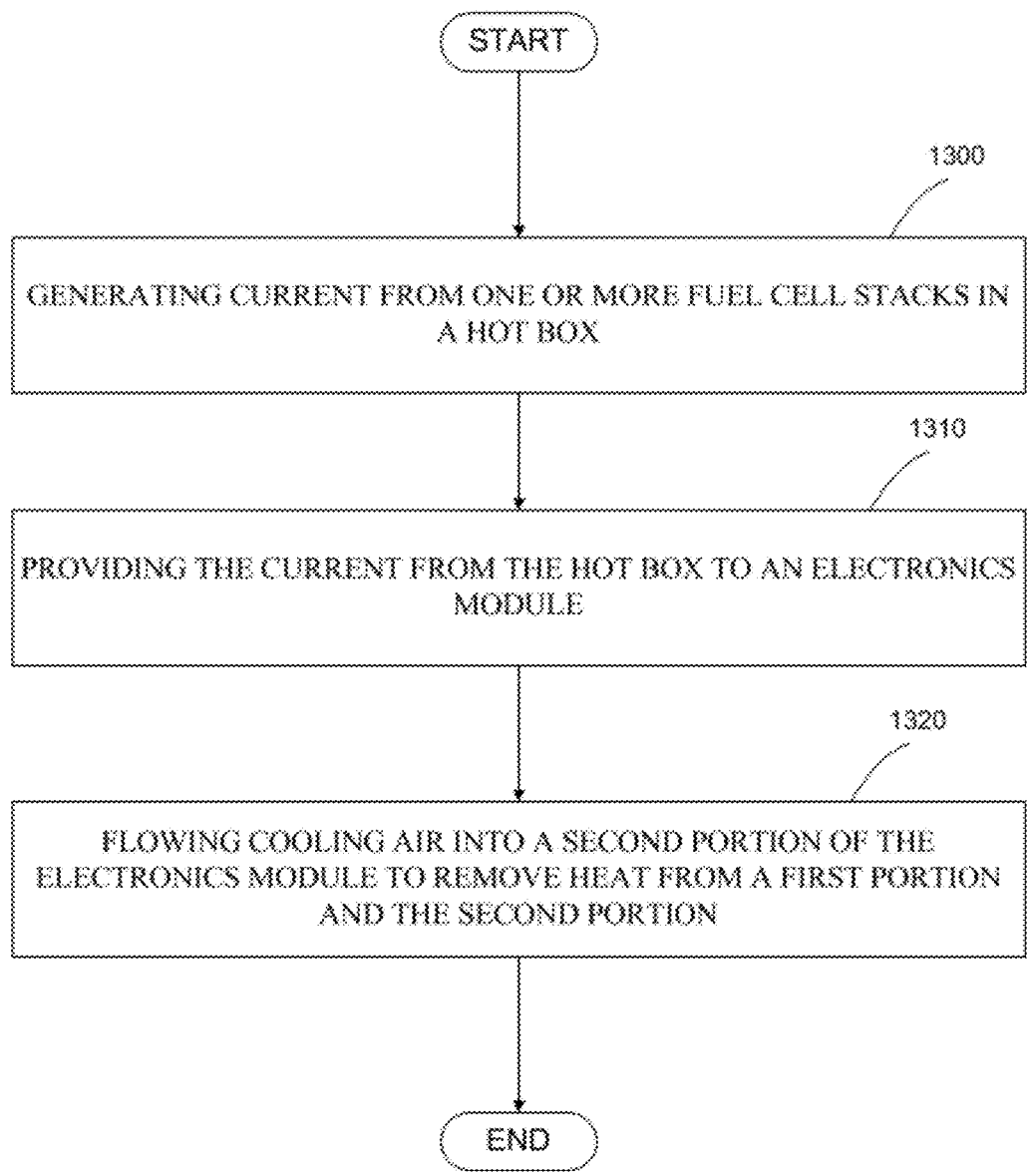
FIG. 13 shows a flowchart illustrating an example of a method of operating the fuel cell system according to the present disclosure.

FIG. 13 shows a flowchart illustrating an example of a method of operating the fuel cell system 10. In one example, the method may include generating current from one or more fuel cell stacks in the hot box 13 located in a first compartment (e.g., the fuel cell cabinet 26) of the fuel cell module cabinet 22 (Step 1300). The method may also include providing the current from the hot box 13 to the electronics module 2 located in a second compartment (e.g., the electrical cabinet 24) of the fuel cell module cabinet 22 (Step 1310). The method may further include flowing cooling air into the second portion 6 of the electronics module 2 to remove heat from the first portion 4 and the second portion 6 (Step 1320). As described above, the first portion 4 may contain air that is substantially stagnant. In some examples, flowing cooling air into the second portion 6 of the electronics module 2 to remove heat from the first portion 4 and the second portion 6 may be performed while maintaining the air in the first portion to be substantially stagnant. Although not shown, it is understood that the method of operating the fuel cell system 10 may include other methods and processes discussed above.

The construction and arrangements of the air-cooled electronics module, the fuel cell module cabinet, the fuel cell system module, and the fuel cell system, as shown in the various examples, are illustrative only. Although only a few examples have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative examples. Other substitutions, modifications, changes, and omissions may also be made in the design, operating conditions and arrangement of the various examples without departing from the scope of the present disclosure. Any one or more features of any example may be used in any combination with any one or more other features of one or more other examples. It is intended that the specification and examples be considered as exemplary only, with a true scope being indicated by the following claims and their equivalents.

What is claimed is:

1. A fuel cell module cabinet, comprising:
a first compartment that contains at least one air-cooled electronics module comprising:
a housing;
a heat exchanger disposed within the housing and separating the housing into a first portion and a second portion;
one or more electronic components disposed within the first portion, and one or more additional electronic components disposed within the second portion; and
at least one fan configured to blow air into the second portion,
wherein the air in the first portion is substantially stagnant; and
a second compartment that contains one or more fuel cell power generation components.

2. The fuel cell module cabinet of claim 1, wherein the at least one fan is disposed at at least one end of the housing.

3. The fuel cell module cabinet of claim 1, wherein the heat exchanger includes at least one fin.

4. The fuel cell module cabinet of claim 3, wherein the at least one fin extends from the heat exchanger toward the second portion.

5. The fuel cell module cabinet of claim 1, wherein the heat exchanger substantially seals the first portion from the second portion.

6. The fuel cell module cabinet of claim 2, wherein the one or more additional electronic components disposed within the second portion comprise at least one of a transformer or an inductor.

7. The fuel cell module cabinet of claim 1, wherein the one or more electronic components disposed within the first portion include at least one of a DC/DC converter or a control circuit.

8. The fuel cell module cabinet of claim 1, further comprising a platform separating the first compartment and second compartment.

9. The fuel cell module cabinet of claim 1, further comprising a door including an inner portion and an outer portion, wherein the one or more power generation components comprise a hot box containing one or more fuel cell stacks and a balance of plant subsystem, and wherein the door further includes a protruding portion extending between the first compartment and the second compartment.

10. A fuel cell system, comprising:
a base;
at least one fuel cell system module disposed on the base; and
at least one of a fuel processing module or a power conditioning module disposed on the base,
wherein the at least one fuel cell system module includes the fuel cell module cabinet of claim 1 connected through the base with at least one of the fuel processing module or the power conditioning module.

11. The fuel cell system of claim 10, wherein:
the air-cooled electronics module comprises a DC/DC converter and a control circuit located within a first portion of a housing of the air-cooled electronics module; and
the air-cooled electronics module further comprises an inductor and a transformer located within a second portion of the housing of the air-cooled electronics module.

12. A method of operating a fuel cell system, comprising:
generating current from one or more fuel cell stacks in a hot box located in a first compartment of a fuel cell module cabinet;
providing the current from the hot box to an electronics module located in a second compartment of the fuel cell module cabinet,
wherein the electronics module comprises a first portion containing at least one electronic component, and a second portion containing at least one additional electronic component,
wherein air contained in the first portion is substantially stagnant, and
wherein the method further comprises flowing cooling air into the second portion of the electronics module to remove heat from the first portion and the second portion.

13. The method of claim 12, wherein the at least one electronic component contained in the first portion generates less heat than the at least one electronic component contained in the second portion, and wherein the at least one electronic component contained in the first portion comprises at least one of a DC/DC converter or a control circuit, and the at least one electronic component contained in the second portion comprises at least one of an inductor or a transformer.

14. The method of claim 12, further comprising transferring heat from the first portion to the second portion using a heat exchanger, wherein the heat transfer comprises at least one fin and wherein the heat exchanger seals the first portion from the second portion.

15. The method of claim 12, wherein flowing cooling air into the second portion comprises blowing air into the second portion using a fan.

* * * * *